United States Patent
LeSage

(10) Patent No.: US 8,107,903 B2
(45) Date of Patent: Jan. 31, 2012

(54) RADIO FREQUENCY AMPLIFICATION CIRCUIT UTILIZING VARIABLE VOLTAGE GENERATOR

(75) Inventor: Steve LeSage, Hillsboro, OR (US)

(73) Assignee: TriQuint Semiconductor, Inc., Hillsboro, OR (US)

( * ) Notice: Subject to any disclaimer, the term of this patent is extended or adjusted under 35 U.S.C. 154(b) by 615 days.

(21) Appl. No.: 12/267,239

(22) Filed: Nov. 7, 2008

(65) Prior Publication Data
US 2010/0120385 A1 May 13, 2010

(51) Int. Cl.
*H01Q 11/12* (2006.01)
*H04B 1/04* (2006.01)

(52) U.S. Cl. .......... 455/127.1; 455/127.2; 455/341; 455/343.1; 330/140

(58) Field of Classification Search ........... 455/91–355; 330/278–297, 127–142
See application file for complete search history.

(56) References Cited

U.S. PATENT DOCUMENTS

| | | | | |
|---|---|---|---|---|
| 4,547,746 | A * | 10/1985 | Erickson et al. | 330/298 |
| 5,059,892 | A | 10/1991 | Stoft | |
| 6,148,220 | A * | 11/2000 | Sharp et al. | 455/572 |
| 6,259,901 | B1 | 7/2001 | Shinomiya | |
| 6,326,690 | B2 * | 12/2001 | Wang et al. | 257/751 |
| 6,624,702 | B1 * | 9/2003 | Dening | 330/297 |
| 6,639,471 | B2 * | 10/2003 | Matsuura et al. | 330/302 |
| 6,683,496 | B2 * | 1/2004 | Poggi et al. | 330/132 |
| 7,190,221 | B2 * | 3/2007 | Henze | 330/136 |
| 7,250,818 | B2 * | 7/2007 | Ayun et al. | 330/140 |
| 7,298,214 | B2 * | 11/2007 | Lee et al. | 330/297 |
| 7,590,395 | B2 * | 9/2009 | Buckley | 455/127.1 |
| 7,605,651 | B2 * | 10/2009 | Ripley et al. | 330/133 |
| 2005/0059362 | A1 | 3/2005 | Kalajo | |
| 2005/0093624 | A1 * | 5/2005 | Forrester et al. | 330/129 |
| 2005/0140436 | A1 * | 6/2005 | Ichitsubo et al. | 330/129 |
| 2006/0220739 | A1 * | 10/2006 | Ben-Ayun et al. | 330/140 |
| 2008/0171523 | A1 * | 7/2008 | Anderson et al. | 455/127.1 |

FOREIGN PATENT DOCUMENTS

EP 1349269 A1 1/2003

* cited by examiner

*Primary Examiner* — Lincoln Donovan
*Assistant Examiner* — Brandon S Cole
(74) *Attorney, Agent, or Firm* — Schwabe Williamson & Wyatt

(57) ABSTRACT

Embodiments of apparatuses, methods, and systems for a radio frequency amplification circuit utilizing a variable voltage generator are generally described herein. Other embodiments may be described and claimed.

16 Claims, 3 Drawing Sheets

RADIO FREQUENCY AMPLIFICATION CIRCUIT UTILIZING VARIABLE VOLTAGE GENERATOR

FIELD

Embodiments of the present invention relate generally to the field of circuits, and more particularly to a radio frequency (RF) amplification circuit utilizing a variable voltage generator.

BACKGROUND

Total radiated power (TRP) is a performance metric that is closely related to functions of an RF amplification circuit of a mobile device. Mobile device manufacturers often desire that the RF amplification circuit provides a target TRP in a variety of real-world scenarios. Existing RF amplification circuits that attempt to provide satisfactory TRP performance also have various operating inefficiencies. For example, an RF amplification circuit may attempt to comply with TRP targets by over-sizing and, therefore, overpowering a power amplifier (PA) so that it will provide sufficient power even under a mismatched load condition. While an oversized amplifier may satisfy TRP objectives, it will not operate at a desired efficiency when it is delivering power into the matched load.

BRIEF DESCRIPTION OF THE DRAWINGS

Embodiments of the invention are illustrated by way of example and not by way of limitation in the figures of the accompanying drawings, in which like references indicate similar elements and in which.

DETAILED DESCRIPTION

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrases "A/B" and "A and/or B" mean (A), (B), or (A and B); and the phrase "A, B, and/or C" means (A), (B), (C), (A and B), (A and C), (B and C) or (A, B and C).

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled to each other.

Various blocks may be introduced and described in terms of an operation provided by the blocks. These blocks may include various hardware, software, and/or firmware elements in order to provide the described operations. While some of these blocks may be shown with a level of specificity, e.g., providing discrete elements in a set arrangement, other embodiments may employ various modifications of elements/arrangements in order to provide the associated operations within the constraints/objectives of a particular embodiment.

Figure 1:
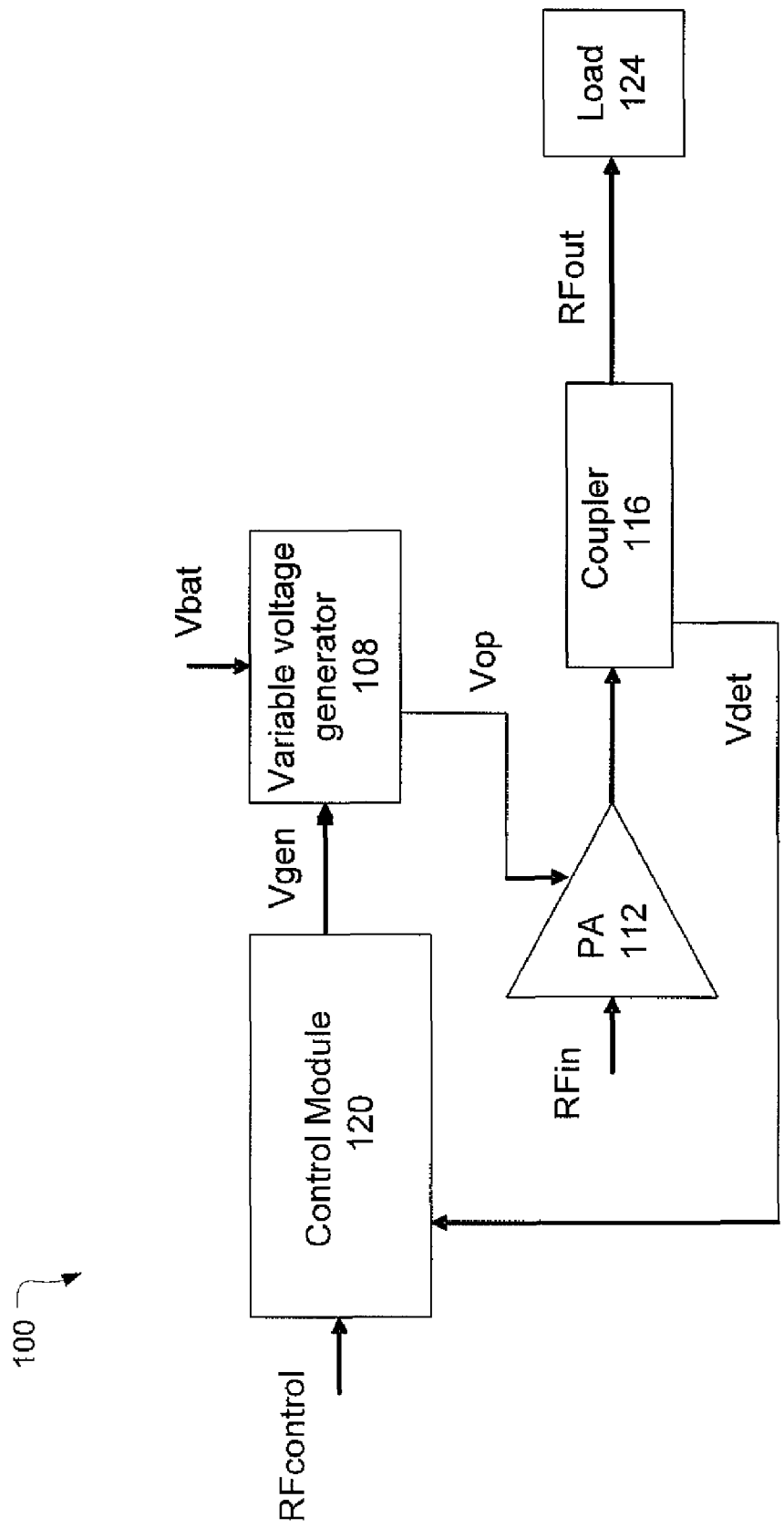
FIG. 1 illustrates an RF amplification circuit in accordance with various embodiments of the present invention.

FIG. 1 illustrates an RF amplification circuit 100 in accordance with various embodiments of the present invention. The RF amplification circuit 100 may have a variable voltage generator 108 to receive a voltage, Vbat, with a set voltage level from a DC voltage source and to variably provide an operating voltage, Vop, to a PA 112 at a selected one of a plurality of voltage levels. As used herein, "variable provision of an operating voltage" means that the variable voltage generator 108 is capable of dynamically changing the voltage level of the operating voltage, Vop, between at least two non-zero voltage levels.

In various embodiments, the variable voltage generator 108 may be a DC-to-DC converter to convert a source of DC from one voltage level to another. In various embodiments, the DC-to-DC converter may be a buck converter, a boost converter, or a buck-boost converter.

The PA 112 may receive an RF input signal, RFin, and amplify it to provide an RF output signal, RFout. The forward power of the PA 112, which may relate to the amount of amplification, may be affected by the variable provision of the operating voltage, Vop.

In some embodiments, the RF amplification circuit 100 may have a coupler 116 configured to sample the RF output signal, RFout, and feed the sample back to a control module 120. The RF output signal, RFout, may also be coupled with a load 124.

The control module 120 may receive an RF power level control, RFcontrol, from, e.g., a baseband controller. The value of the RF power level control, RFcontrol, may correspond to a total forward power (TFP) target value of the RF amplification circuit 100. The TFP target value may be generated based at least in part on feedback from a device, e.g., a base station, that has a wireless connection with a device, e.g., a mobile station, hosting the RF amplification circuit 100. The base station may determine that the wireless connection is becoming weak and may send a request to the mobile station to increase the TFP target value to strengthen the wireless connection. The baseband controller may then increase the RF power level control, RFcontrol, accordingly. The TRP target value, discussed above, may be the TFP target value minus a reverse power that is based at least in part on line reflections.

The control module 120 may include a number of circuit elements cooperatively configured to provide the associated control functions described herein. These elements may include, e.g., a detector, a comparator, etc.

In various embodiments, the PA 112 may be load sensitive, resulting in a value of the RF output signal, RFout, being based at least in part on an input impedance associated with the load 124. More specifically, the value of the RF output signal, RFout, may be based at least in part on whether the input impedance associated with the load 124 is matched with an effective output impedance associated with the PA 112. For example, if the input impedance of the load 124 is matched to the effective output impedance of the PA 112, e.g., at 50 ohms, the RF output signal may have a first value. However, if the input impedance of the load 124 were to change, e.g., as a result of an attached antenna being shielded, an impedance mismatch condition may occur. This may result in the value of the RF output signal, RFout (assuming constant function of the variable voltage generator 108) changing somewhat from the first value. A change in the value of the RF output signal, RFout, resulting from such a mismatch condition, may compromise the ability of the RF amplification circuit 100 to meet the TFP target value.

Accordingly, in some embodiments, the control module 120 may use an RF sample, Vdet, provided by the coupler 116, to detect a change in the forward power associated with a mismatch condition. If such an event is detected, the control module 120 may then provide a generator voltage, Vgen, to the variable voltage generator 108 in a manner to efficiently facilitate meeting the desired TFP target value, as will be explained now with reference to FIG. 2.

Figure 2:
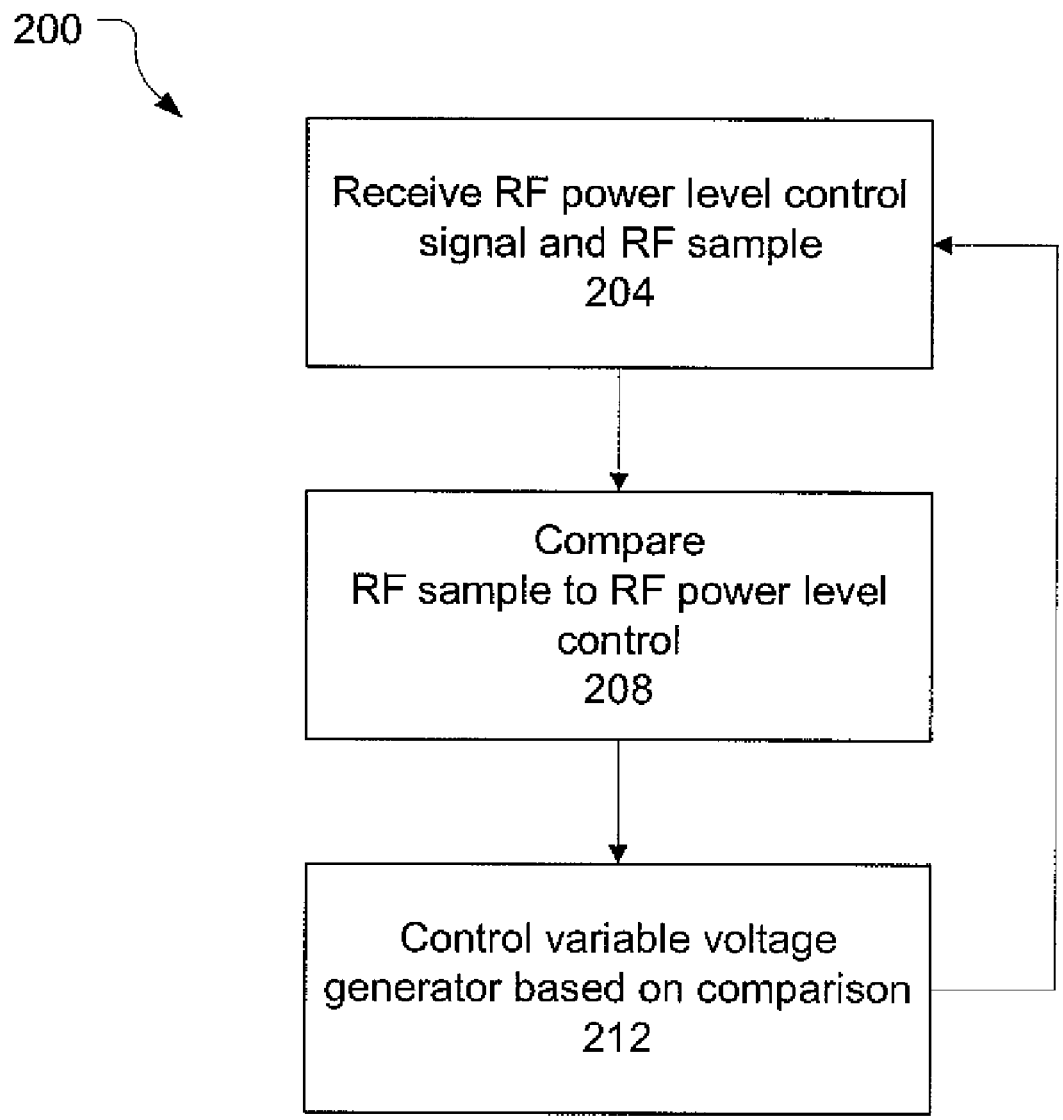
FIG. 2 is a flowchart depicting operation of a control module in accordance with various embodiments of the present invention.

FIG. 2 illustrates a control operation 200 that may be performed by the control module 120 in accordance with an embodiment of the present invention. At block 204, an RF power level control may be received, e.g., from a baseband controller, and the RF sample, Vdet, may be received, e.g., from the coupler 116. In various embodiments, the sampling of the RF output signal may be continuous, periodic, and/or event-driven.

At block 208, the RF sample, Vdet, may be compared to the RF power level control, RFcontrol. This comparison may provide information as to whether the TFP targets are being satisfied by the current operation of the RF amplification circuit 100.

At block 212, the variable voltage generator 108 may be controlled based at least in part on the comparison of block 208. In some embodiments, the comparison may reveal that the RF sample, Vdet, is no longer equal to, or within a predetermined range of, the RF power level control, RFcontrol. This may result from an occurrence of an impedance mismatch condition that results in a change in the forward power provided by the PA 112. This change in the forward power may compromise the ability of the RF amplification circuit 100 to meet the TFP target value.

In the event that the comparison of block 208 reveals that the RF sample, Vdet, is greater than the RF power level control, RFcontrol, the level of the operating voltage, Vop, may be stepped down. Conversely, in the event that the comparison of block 208 reveals that the RF sample, Vdet, is less than the RF power level control, RFcontrol, the level of the operating voltage, Vop, may be stepped up.

Following the control process of block 212, the control operation 200 may loop back to block 204 to provide a feedback control loop that continuously monitors the RF sample, Vdet, with respect to the RF power level control, RFcontrol, and controls the operating voltage, Vop, accordingly.

In some embodiments, stepping the operating voltage, Vop, up or down may be done by the control module 120 adjusting the generator voltage, Vgen, to control the variable voltage generator 108 in a desired manner. The operating voltage, Vop, may be set at any value within a given range from the set voltage, Vbat. In some embodiments, depending on the type of variable voltage generator 108 used, the operating voltage, Vop, may be equal to, greater than, and/or less than the set voltage, Vbat.

In such a manner, the variable voltage generator 108 may be controlled to variably provide the PA 112 with an operating voltage at a selected one of a plurality of voltage levels, to affect a desired forward power of the PA 112, based at least in part on the RF sample, Vdet. Thus, the variable voltage generator 108 may dynamically provide the PA 112 with sufficient voltage headroom to comply with set TFP target values under a mismatched condition.

In a particular example, consider that a set voltage, Vbat, is 3.5 volts, with the operating voltage, Vop, initially set to a base level of 4.5 volts. If, during the control operation 200, the operating voltage, Vop, gets increased to a boosted level of 5.4 volts, the boosted level may then be approximately 1.2 times the base level. In this embodiment, the PA 112 may have a power headroom of approximately 1.5 decibels (dB) to overcome a mismatched load. However, unlike the overpowered applications of the prior art, the forward power of the PA 112 is controlled at a relatively constant efficiency due to the control of the variable voltage generator 108 described herein. Thus, the PA 112 may be as efficient driving a matched load at the base level of 4.5 volts as driving a mismatched load at the boosted level of 5.4 volts.

In another example, the variable voltage generator 108, which may be a buck converter in this example, may set the operating voltage, Vop, to 3.1 volts for normal operation. In a mismatched condition, where the PA 112 is to provide an additional 1.5 dB of power, the variable voltage generator 108 may increase the operating voltage, Vop, to 3.5 volts.

Figure 3:
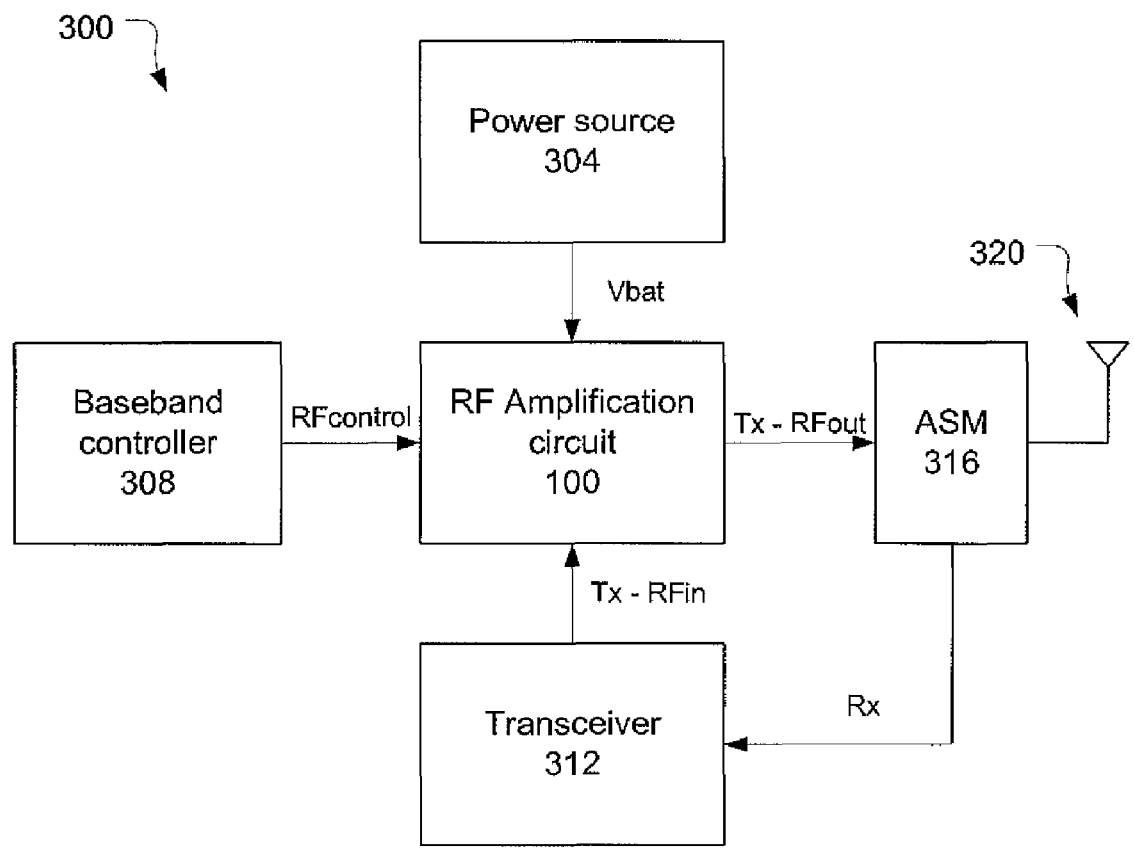
FIG. 3 illustrates a mobile device having an RF amplification circuit in accordance with various embodiments of the present invention.

FIG. 3 illustrates a mobile device 300 including the RF amplification circuit 100 in accordance with various embodiments of the present invention. The mobile device 300 may include a power source 304, a baseband controller 308, and a transceiver 312 coupled with the RF amplification circuit 100 as shown.

The RF amplification circuit 100 may receive the set voltage, Vbat, from the power source 304, the RF power level control, RFcontrol, from the baseband controller 308, and the RF input signal, RFin, from the transceiver 312. The RF amplification circuit 100 may amplify the RF input signal, RFin, to provide the RF output signal, RFout. The RF input signal, RFin, and the RF output signal, RFout, may both be part of a transmit chain, respectively noted by Tx-RFin and Tx-RFout in FIG. 3.

The amplified RF output signal, RFout, may be provided to an antenna switch module (ASM) 316, which effectuates an over the air (OTA) transmission of the RF output signal, RFout, via an antenna structure 320. The ASM 316 may also receive RF signals via the antenna structure 320 and couple the received RF signals to the transceiver 312 along a receive chain.

In various embodiments, the antenna structure 320 may include one or more directional and/or omnidirectional antennas, including, e.g., a dipole antenna, a monopole antenna, a patch antenna, a loop antenna, a microstrip antenna or any other type of antenna suitable for OTA transmission/reception of RF signals.

In various embodiments, the power source 304 may be, but is not limited to, a battery, a solar panel, a rectifier, a DC generator, etc.

In various embodiments, the mobile device 300 may be a mobile phone, a personal digital assistant (PDA), a mobile computer, etc. The mobile device 300 may be compatible with any of a number of cellular communication protocols, e.g., a global system for mobile communications (GSM), universal mobile telecommunication system (UMTS), code division multiple access (CDMA), etc. In other embodiments, the mobile device 300 may be additionally/alternatively compatible with computer network communication protocols, e.g., Worldwide Interoperability for Microwave Access (WiMax), High Performance Radio Metropolitan Area Network (HIPERMAN), etc.

By using the RF amplification circuit 100 as described, the mobile device 300 may be able to conserve the energy provided by the power source 304, which may translate into longer operating times, commonly referred to as "talk time," while still maintaining desired TRP performance in a wide variety of real-world scenarios.

Although the present invention has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This description is intended to be regarded as illustrative instead of restrictive on embodiments of the present invention.

What is claimed is:

1. A circuit comprising:
   a power amplifier to receive a radio frequency (RF) input signal and to transmit an RF output signal;
   a variable voltage generator coupled with the power amplifier, to variably provide the power amplifier with a voltage at a selected one of a plurality of voltage levels; and
   a control module coupled with the power amplifier and the variable voltage generator, the control module configured to
      receive a sample of the RF output signal,
      receive an RF power level control that corresponds to a desired total forward power value of the circuit, and
      control the variable provision of the voltage to the power amplifier by the variable voltage generator, to affect forward power of the power amplifier, based at least in part on the sample and the RF power level control,
   wherein the control module is configured to control the variable provision of the voltage by being configured to
      control the variable voltage generator to provide the voltage at a first level to satisfy the desired total forward power value in a matched condition in which an effective output impedance is matched with an input impedance of a load, the first level to further provide voltage headroom for provision of the voltage at a second level;
      detect, based at least in part on the sample, a mismatched condition in which the effective output impedance does not match the input impedance of the load; and
      provide the voltage at the second level to satisfy the desired total forward power value based at least in part on detection of the mismatched condition.

2. The circuit of claim 1, wherein the variable voltage generator is a direct current (DC)-to-DC converter.

3. The circuit of claim 2, wherein the DC-to-DC converter is a boost converter, a buck converter, or a buck-boost converter.

4. The circuit of claim 1, wherein the control module is to compare the sample of the RF output signal to the RF power level control, and to control the variable voltage generator based at least in part on said comparison.

5. A method comprising:
   amplifying, with a power amplifier, a radio frequency (RF) input signal, to provide an RF output signal;
   sampling the RF output signal to obtain a sample;
   receiving an RF power level control that corresponds to a desired total forward power value of an RF amplification circuit; and
   controlling a variable voltage generator to variably provide the power amplifier with a voltage at a selected one of a plurality of voltage levels, to affect forward power of the power amplifier, based at least in part on the sample and the RF power level control,
   wherein controlling the variable voltage generate further includes:
      controlling the variable voltage generator to provide the voltage at a first level to satisfy the desired total forward power value in a matched condition in which an effective output impedance is matched with an input impedance of a load, the first level to further provide voltage headroom for provision of the voltage at a second level;
      detecting, based at least in part on the sampling, a mismatched condition in which the effective output impedance does not match the input impedance of the load; and
      providing the voltage at the second level to satisfy the desired total forward power value based at least in part on detecting the mismatched condition.

6. The method of claim 5, further comprising:
   comparing the sample to the RF power level control; and
   controlling the variable voltage generator based at least in part on said comparing of the sample to the RF power level control.

7. The method of claim 6, wherein said controlling the variable voltage generator further comprises:
   detecting a change in forward power of the power amplifier based at least in part on said comparing of the sample to the RF power level control; and
   controlling the variable voltage generator to increase the selected voltage level of the voltage provided to the power amplifier based at least in part on said detecting of the change in forward power.

8. The method of claim 6, wherein the sample is a first sample and the method further comprises: sampling the RF output signal to obtain a second sample; comparing the second sample to the RF power level control; and controlling the variable voltage generator to variably provide the voltage at a second voltage level of the plurality of voltage levels based at least in part on said comparing of the second sample to the RF power level control.

9. The method of claim 5, further comprising: transmitting the RF output signal over an over the air link.

10. An apparatus comprising:
   a transceiver to provide a radio frequency (RF) input signal; and
   an RF amplification circuit coupled with the transceiver, wherein the RF amplification circuit includes a power amplifier to receive the RF input signal from the transceiver and to transmit an RF output signal;
a variable voltage generator coupled with the power amplifier, to variably provide the power amplifier with a voltage at a selected one of a plurality of voltage levels; and
a control module coupled with the power amplifier and the variable voltage generator, to receive a sample of the RF output signal, receive an RF power level control that corresponds to a desired total forward power value of the RF amplification circuit, and control the variable provision of the voltage to the power amplifier by the variable voltage generator, to affect forward power of the power amplifier, based at least in part on the sample and the RF power level control,
wherein the control module is configured to control the variable provision of the voltage by being configured to control the variable voltage generator to provide the voltage at a first level to satisfy the desired total forward power value in a matched condition in which an effective output impedance is matched with an input impedance of a load, the first level to further provide voltage headroom for provision of the voltage at a second level;
detect, based at least in part on the sample, a mismatched condition in which the effective output impedance does not match the input impedance of the load; and
provide the voltage at the second level to satisfy the desired total forward power value based at least in part on detection of the mismatched condition.

11. The apparatus of claim 10, wherein the variable voltage generator is a direct current (DC) to DC converter.

12. The apparatus of claim 11, wherein the DC-to-DC converter is a boost converter, a buck converter, or a buck-boost converter.

13. The apparatus of claim 10, further comprising: a power source coupled with the variable voltage generator to provide a set voltage level to the variable voltage generator, the set voltage level being less than at least some of the plurality of voltage levels.

14. The apparatus of claim 10, wherein the control module is to compare the sample of the RF output signal to the RF power level control, and to control the variable voltage generator based at least in part on said comparison.

15. The apparatus of claim 10, further comprising: an antenna structure coupled with the RF amplification circuit to transmit the RF output signal over an over the air link.

16. The apparatus of claim 15, wherein the input impedance and the effective output impedance are matched at 50 ohms.

* * * * *